United States Patent [19]
Kirk et al.

[11] Patent Number: 5,369,650
[45] Date of Patent: Nov. 29, 1994

[54] ERROR DETECTION AND CORRECTION APPARATUS IN A BY-4 RAM DEVICE

[75] Inventors: David L. Kirk, Phoenix; Jay W. Gustin, Scottsdale, both of Ariz.

[73] Assignee: Honeywell, Inc., Minneapolis, Minn.

[21] Appl. No.: 797,515

[22] Filed: Nov. 22, 1991

[51] Int. Cl.$^5$ .............................................. H03M 13/00
[52] U.S. Cl. .................................. 371/40.1; 371/40.2; 371/37.2
[58] Field of Search .................... 371/40.1, 40.2, 37.2, 371/21.6

[56] References Cited

U.S. PATENT DOCUMENTS

| | | | |
|---|---|---|---|
| 3,755,779 | 8/1973 | Price | 340/146.1 AL |
| 4,884,271 | 11/1989 | Concha et al. | 371/40.2 |
| 4,903,268 | 2/1990 | Hidaka et al. | 371/40.1 |
| 5,164,944 | 11/1992 | Benton et al. | 371/40.1 |

OTHER PUBLICATIONS

Kaufman D., "Fault-Tolerant Memory with Single Error Correcting Codes", IBM Technical Disclosure Bulletin, vol. 26 No. 11, Apr. 1984, pp. 6142–6144.

*Primary Examiner*—Robert W. Beausoliel, Jr.
*Assistant Examiner*—Ly V. Hua
*Attorney, Agent, or Firm*—Arthur A. Sapelli; William Udseth; Albin Medved

[57] ABSTRACT

A memory unit, made up of a plurality of BY-4 memory devices, has a plurality of computer words, each computer word including a predetermined number of data bits and a predetermined number of check bits. An error detection and correction (EDAC) apparatus interfaces with the memory unit for detecting and correcting a single bit error of the computer word, detecting a two bit error of the computer word, and detecting all two, three, and four bit errors of a single memory device. Matrix logic generates the check bits from preselected participating data bits of the data bits of the computer word being fetched. Compare gate logic compares check bits from the memory unit to corresponding check bits generated by the matrix logic to generate syndrome bits. Detection logic decodes the syndrome bits in accordance with a predetermined matrix mapped to identify one and two bit errors, to identify two, three, and four bit errors of the computer word when such errors are associated with the same BY-4 memory device, and to generate status signals associated with the decoding. Correction gate logic corrects the data bit of the computer word identified as being in error.

8 Claims, 8 Drawing Sheets

| CHECK BIT | PARITY | \multicolumn{32}{c}{PARTICIPATING DATA BITS} |
|---|---|---|

| CHECK BIT | PARITY | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|---|
| C0 | EVEN(XOR) | | | | | x | | | | | | | | x | x | x | x | x | x | x | | | | | | x | x | | | | | x | x |
| C1 | ODD(XNOR) | x | x | x | | | | | x | x | | | | x | x | | | | | | | | x | x | | x | | | x | x | x | | |
| C2 | EVEN(XOR) | x | x | x | | x | x | x | x | | | | | | | x | x | x | | x | x | | x | | | x | x | x | | x | x | x | x |
| C3 | ODD(XNOR) | x | | x | | | | x | | x | x | x | | | | x | | | x | | x | x | | | x | | | | x | x | x | x | x |
| C4 | EVEN(XOR) | x | x | | | x | | | | | | | x | | x | | | x | | x | x | x | x | x | x | | | | | x | x | x | x |
| C5 | EVEN(XOR) | | | | | | | | | x | x | x | x | | x | | | x | x | x | x | x | x | x | | x | x | x | | x | | | |
| C6 | EVEN(XOR) | x | x | x | x | | | | | x | x | x | x | x | | | | | | | x | x | x | | x | | | | x | x | | x | |
| C7 | EVEN(XOR) | x | x | x | x | | | | | x | x | x | x | x | x | x | x | | | | | x | x | x | | x | x | x | | x | x | x | |

| SYNDROME BITS | S0 | 0 | 1 | 0 | 1 | 0 | 1 | 0 | 1 | 0 | 1 | 0 | 1 | 0 | 1 | 0 | 1 |
|---|---|---|---|---|---|---|---|---|---|---|---|---|---|---|---|---|---|
| | S1 | 0 | 0 | 1 | 1 | 0 | 0 | 1 | 1 | 0 | 0 | 1 | 1 | 0 | 0 | 1 | 1 |
| | S2 | 0 | 0 | 0 | 0 | 1 | 1 | 1 | 1 | 0 | 0 | 0 | 0 | 1 | 1 | 1 | 1 |
| | S3 | 0 | 0 | 0 | 0 | 0 | 0 | 0 | 0 | 1 | 1 | 1 | 1 | 1 | 1 | 1 | 1 |
| S7 S6 S5 S4 | | | | | | | | | | | | | | | | | |
| 0 0 0 0 | | * | C0 | C1 | T | C2 | T | T | M | C3 | T | T | M | T | M | M | M |
| 1 0 0 0 | | C4 | T | T | M | T | TR | M | M | T | TR | M | M | TR | M | M | M |
| 0 1 0 0 | | C5 | T | T | M | T | M | 7 | 15 | TR | M | M | 6 | M | M | M | M |
| 1 1 0 0 | | T | M | M | TR | M | 5 | 4 | M | M | M | M | 27 | M | M | TR | M |
| 0 0 1 0 | | C6 | T | T | M | T | T | M | TR | TR | M | TR | M | TR | M | M | M |
| 1 0 1 0 | | T | M | M | TR | M | M | M | M | M | M | TR | M | M | TR | M | M |
| 0 1 1 0 | | T | M | M | M | M | M | M | TR | M | TR | M | M | M | M | TR | M |
| 1 1 1 0 | | M | M | M | M | M | 23 | M | M | M | M | M | M | 31 | M | TR | M |
| 0 0 0 1 | | C7 | T | T | M | T | T | TR | M | T | M | M | M | M | M | M | M |
| 1 0 0 1 | | T | M | M | M | M | M | M | TR | M | 21 | 1 | M | M | M | TR | M |
| 0 1 0 1 | | T | M | M | M | M | M | 17 | M | M | M | M | TR | M | M | TR | M |
| 1 1 0 1 | | TR | TR | TR | 11 | M | M | M | 14 | M | M | 24 | M | 13 | M | M | M |
| 0 0 1 1 | | T | M | M | M | M | M | M | TR | M | 22 | M | M | M | M | TR | 29 |
| 1 0 1 1 | | TR | M | M | M | M | TR | M | M | M | M | M | M | M | 12 | TR | M |
| 0 1 1 1 | | TR | M | M | M | M | 19 | 25 | M | 16 | 3 | M | 8 | M | 30 | 28 | M |
| 1 1 1 1 | | M | M | M | M | M | M | 26 | M | M | 10 | M | M | M | M | 18 | 2 |

* - NO ERRORS DETECTED
T - TWO BIT ERROR DETECTED
TR - THREE BIT ERROR DETECTED
M - MORE THAN THREE BIT ERROR DETECTED
C0 - C7 - CHECK BITS ERROR
N(NUMBER) - DATA BIT NUMBER IN ERROR

ERROR DETECTION AND CORRECTION APPARATUS IN A BY-4 RAM DEVICE

BACKGROUND OF THE INVENTION

The present invention relates to an Error Detection and Correction (EDAC) apparatus, and more particularly, to an EDAC apparatus for use with a memory unit utilizing BY-4 memory chips.

Previous memory architectures are structured to utilize BY-1 memory devices, e.g., Random Access Memory (RAM) or Dynamic Random Access Memory (DRAM), there generally being no need to protect any more than a 1 bit failure or a 1 bit soft error at a time for such devices. (BY-1 memory devices include those devices well known in the art such as 4K BY-1, 16K BY-1, or 64K BY-1 RAM organization, also denoted as $4K \times 1$, $16K \times 1$, or $64K \times 1$, respectively.) Thus, for a 32 bit word memory, 32 BY-1 memory chips are utilized, and if a 1K word memory unit having 32 bits per word is desired, 32 chips of a 1K BY-1 are utilized.

As a result of memory density increase, BY-4 memory devices (or chips) have been developed which are more economical and are finding widespread acceptance and usage in current systems. Thus, it can be seen for the same 1K word memory unit, having 32 bits per word, 8 memory chips of a 1K BY-4 are utilized.

There currently exists a variety of EDAC schemes which can detect and correct 1 bit errors in a word fetched from the memory unit. Some EDAC schemes can detect all two bit errors in a word and some three and four bit word errors.

A need exists to detect all two bit word errors, and to detect all two, three, and four bit errors of the same chip of a BY-4 memory device. The present invention provides an apparatus which detects and corrects all one bit errors, detects all two bit word errors of a computer word, and detects all two, three, and four bit errors on the same chip.

SUMMARY OF THE INVENTION

Therefore, there is provided by the present invention, an Error Detection and Correction (EDAC) apparatus for detecting and correcting all 1 bit errors, and detecting all 2 bit, errors of a word, and detects all 2 bits, 3 bit, and 4 bit errors of a single BY-4 memory chip utilized in a memory unit. In a system there is included a processor and a memory unit, the memory unit storing information for subsequent use. The memory unit is made up of a plurality of BY-4 memory devices thereby forming a plurality of computer words, each computer word having a predetermined number of bits. The computer word includes a predetermined number of data bits and a predetermined number of check bits associated therewith. An error detection and correction (EDAC) apparatus interfaces with the memory unit for detecting and correcting a single bit error of the computer word, detecting a two bit error of the computer word, and detecting all two, three, and four bit errors of a single memory device, upon fetching the computer word from the memory unit. The EDAC apparatus comprises matrix logic, operatively connected to the memory unit, for generating the predetermined number of check bits from preselected participating data bits of the data bits of the computer word being fetched. Compare gate logic, operatively connected to the matrix logic and to the memory unit to receive the predetermined number of check bits generated by the matrix logic and the predetermined number of check bits stored in the memory unit associated with the computer word being fetched, respectively, compares corresponding check bits to generate corresponding syndrome bits therefrom. Detection logic, operatively connected to the compare gate logic to receive the syndrome bits, decodes the syndrome bits in accordance with a predetermined matrix mapped to identify one and two bit errors of the computer word being fetched, to identify two, three, and four bit errors of the computer word when such errors are associated with the same BY-4 memory device, and to generate status signals associated with the decoding. Correction gate logic, operatively connected to the detection logic and to the memory unit, corrects the data bit of the computer word identified as being in error, thereby outputting a corrected data portion of the fetched computer word, the identified data bit being corrected when such error is detected.

Accordingly, it is an object of the present invention to provide an Error Detection and Correction (EDAC) apparatus for a memory unit.

It is another object of the present invention to provide an EDAC apparatus for a memory unit made up of a plurality of a BY-4 memory chips.

It is still another object of the present invention to provide an EDAC apparatus for detecting and correcting a 1 bit word error, detecting a 2 bit word error, and detecting all 2 bit, 3 bit, and 4 bit errors of a single BY-4 memory chip of a memory unit.

These and other objects of the present invention will become more apparent when taken in conjunction with the following description and attached drawings, wherein like characters indicate like parts, and which drawings form a part of the present application.

BRIEF DESCRIPTION OF THE DRAWINGS

FIG. 1, which comprises

DETAILED DESCRIPTION

Figure 1A:
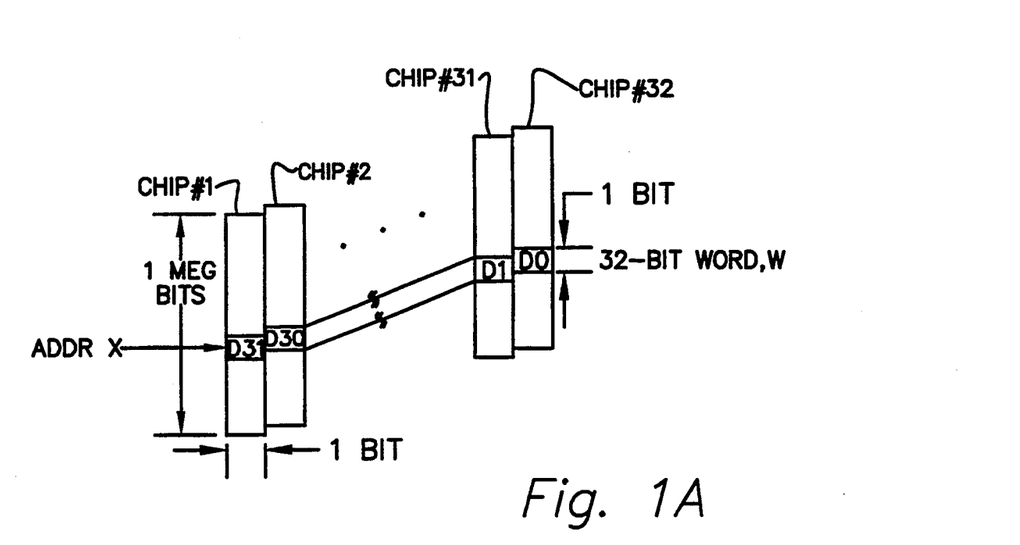
FIGS. 1A, 1B and 1C, shows memory unit configurations utilizing a plurality of memory devices (or memory chips)
Figure 1B:
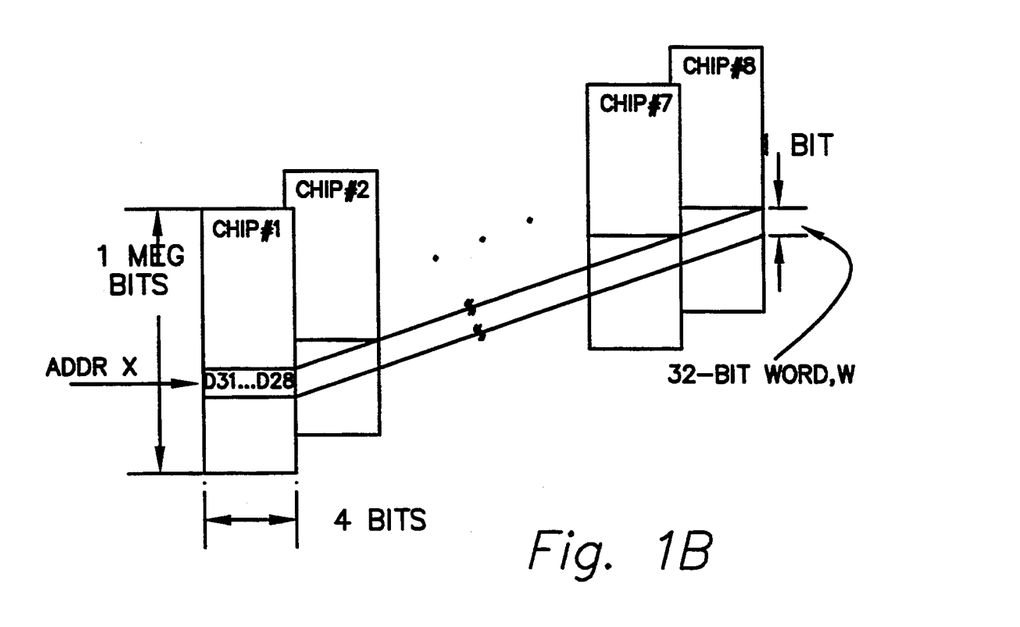
Figure 1C:
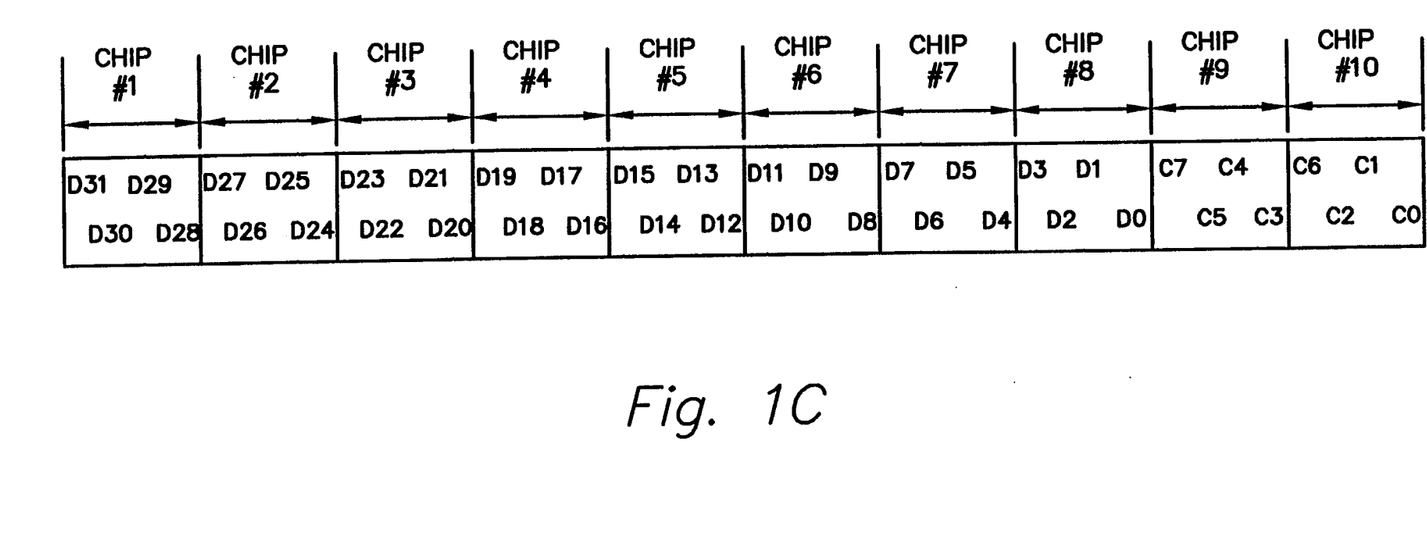

Referring to FIG. 1, which comprises FIGS. 1A, 1B, and 1C, there is shown a variety of memory unit configurations made up from a plurality of differing memory devices (or memory chips). FIG. 1A shows a memory unit having a 32 bit word, W, utilizing BY-1 memory chips. Thirty two BY-1 memory chips are utilized and arranged to form a 1 mega word memory unit having a 32 bit word, wherein each word is addressable. Thus, for word W having address X (ADDR X), chip 1 contains data bit 31 ($D_{31}$), chip 2 contains $D_{30}$, . . . and chip 32 contains $D_0$. Each chip of word W has address location X. Each of the 32 BY-1 chips in this example is 1 mega bit long resulting in a memory unit having 1 mega words, each word being 32 bits long, and further wherein each word of the memory unit is addressable.

FIG. 1B shows a memory unit having a 32 bit word, W, utilizing BY-4 memory chips. Eight BY-4 chips are utilized and arranged to form a 1 mega word memory unit having a 32 bit word, wherein each word is addressable. Thus, for word W having address X (ADDR X) chip one contains 4 data bits; namely, data bit 31, data bit 30, data bit 29, and data bit 28 ($D_{31}$, $D_{30}$, $D_{29}$, and $D_{28}$, respectively). Chip 2 contains data bit 27, . . . Each chip of word W has address location X. Each of the 8 BY-4 chip in this example is 1 mega nibble (where a nibble is 4 bits wide) long resulting in a memory unit having 1 mega word, each word being 32 bits long, and further wherein each word of the memory unit is addressable. Since 4 data bits are on a single chip (thus the nomenclature BY-4) only 8 chips are required to form a 32 bit word. The memory unit of FIG. 1B and the memory unit of FIG. 1A contains exactly the same amount of memory.

FIG. 1C shows a memory unit organization of the preferred embodiment of the present invention which is a 32 bit word memory unit made up of 8 memory chips (or memory devices), chips 1 through 8. Memory chips 9 and 10 are added for storing check bits associated with the 32 bit data word, W, the check bits being utilized by an Error Detection and Correction apparatus of the present invention which will now be described.

Figure 2:
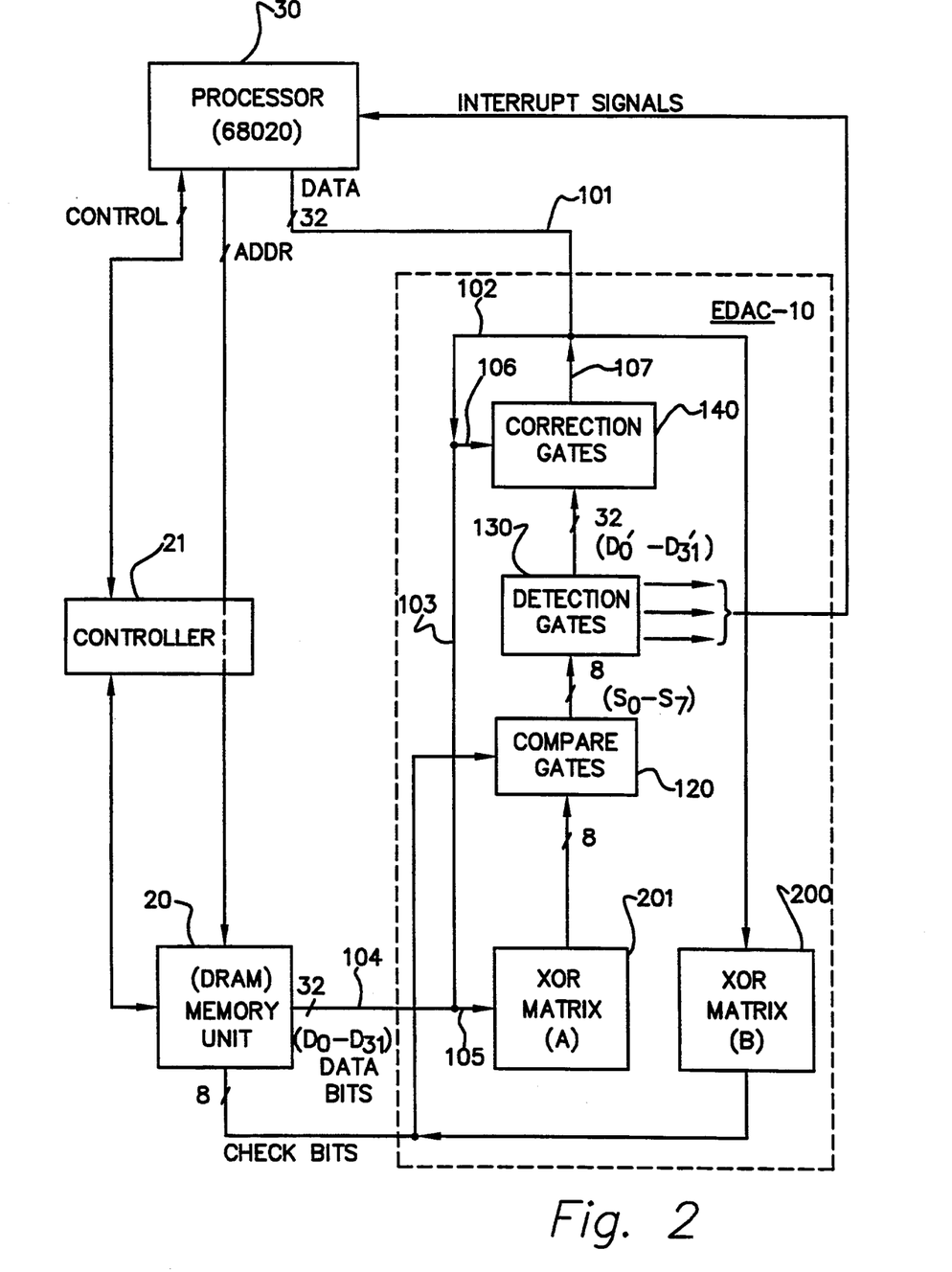
FIG. 2 shows a computer system which includes a processor, a memory unit and an error detection and correction (EDAC) apparatus of the preferred embodiment of the present invention.

Referring to FIG. 2, there is shown a computer system which includes a processor, a memory unit and an Error Detection and Correction (EDAC) apparatus 10 of the preferred embodiment of the present invention. In the preferred embodiment of the present invention the memory unit 20 is a Dynamic Random Access Memory (DRAM) made up of 10 memory chips (i.e., memory devices) of 1 meg BY-4. Memory chips 1-8 contain data bits $D_{31}$ through $D_0$, and memory chips 9 and 10 contain the 8 check bits as discussed above in conjunction with FIG. 1C. A processor 30 (in the preferred embodiment of the present invention the processor is a Motorola 68020) is operatively connected to the memory unit 20. A memory controller 21 is shown operatively connected to the processor 30 and the memory unit 20 for delivering control signals, status signals, and address signals between the processor 30 and the memory unit 20 (CONTROL). Locations of the memory unit 20 are addressable by the processor 30 via address line (ADDR) the number of address lines determined by the size of the memory unit 20, i.e., the number of words to be addressed. The processor 30 can interface with other devices well known in the art such as input/output controllers (not shown), . . .

Information flow between the memory unit 20 and the processor 30 goes through the EDAC apparatus 10 of the present invention. It will be recognized by those skilled in the art that information comprises both program instructions and data. Thus, depending on the context, data, as used herein, (and data bits) can include both data and program instructions.

When data is to be stored in the memory unit 20, 32 bits of data are outputted from the processor 30 via lines 101, and follows the path provided by lines 102, 103, 104, to the memory unit 20. In addition the 32 bits of data is coupled to a XOR matrix (B) 200 which generates 8 check bits associated with the 32 bit data word, and is stored in the memory unit in a location associated with the 32 bit data word forming a total of a 40 bit word.

When data is to be read from the memory unit 20, the 32 data bits are inputted to an XOR matrix (A) 201 via the path of lines 104, 105. The XOR matrix (A) generates the check bits based on the 32 data bits just read and inputs the check bits into a compare gates logic 120. Also coupled into the compare gates 120 are the 8 check bits stored in the memory unit 20 associated with the data work just read. The compare gates compares each check bit with the corresponding check bit just generated, and generates therefrom syndrome bits $S_0$–$S_7$. The syndrome bits are coupled to detection gates logic 130 and generates bits $D_0'$ through $D_{31}'$. These generated data bits are coupled into correction gate logic 140. Also coupled into correction gate logic 140 is the 32 bit data word from memory unit 20 via lines 104, 103, 106. If an error was detected on any of the data bits $D_0$ through $D_{31}$, the bit is corrected, providing it is a single bit error. The 32 data bits (including the single correction) are then coupled to the processor 30 from the correction gates logic 140 via lines 107, 101. The detection gates logic 130 also outputs status/control signals which indicates whether an error existed, single or multiple, or whether there was no error detected, and couples these signals back to the processor 30, in the form of an interrupt signal, for handling by the processor 30. The XOR matrix (A) 201 and XOR matrix (B) 200 contain the same logic, but are duplicated for speed purposes. It will be recognized by the skilled in the art that the same XOR matrix can be utilized for both the read or write operation to the memory unit 20 in conjunction with some additional switching hardware.

Figure 3:
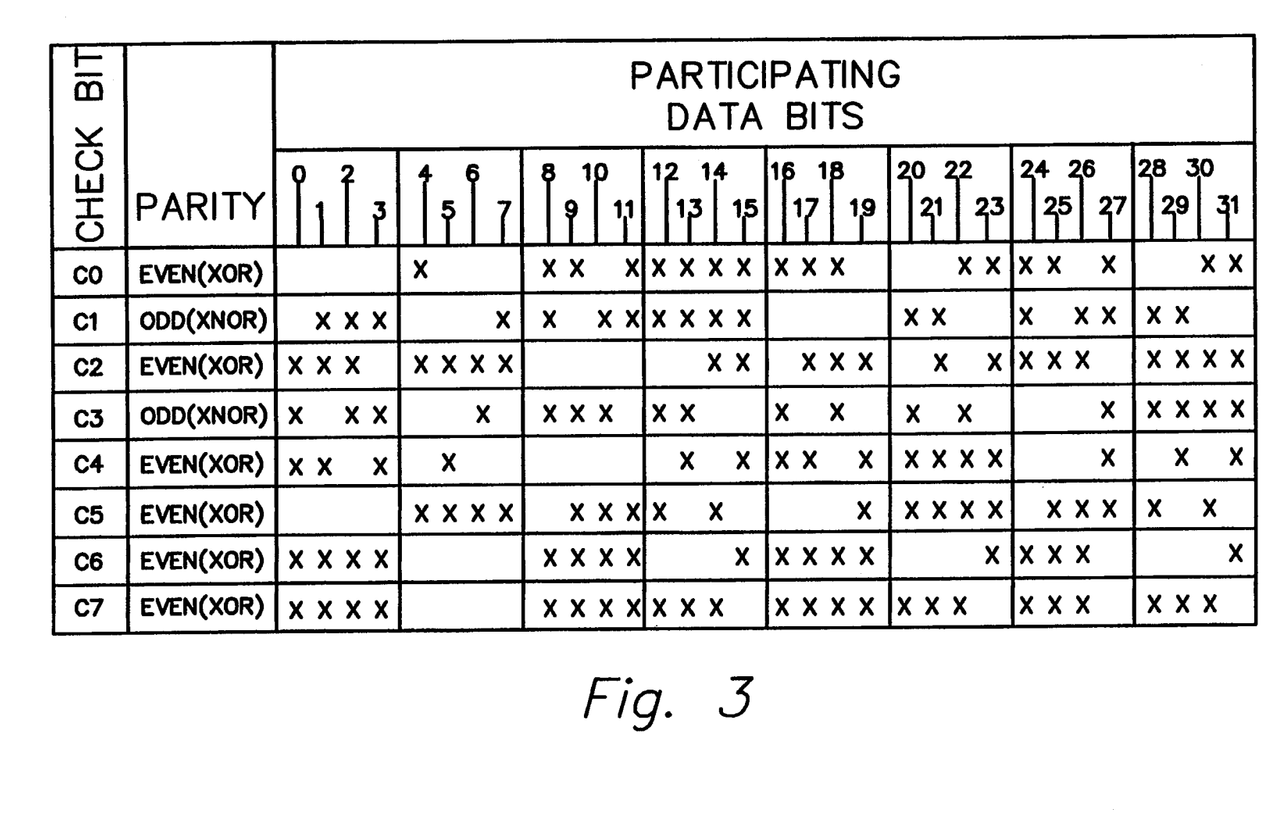
FIG. 3 shows a matrix for generating the check bits of the present invention.
Figure 4:
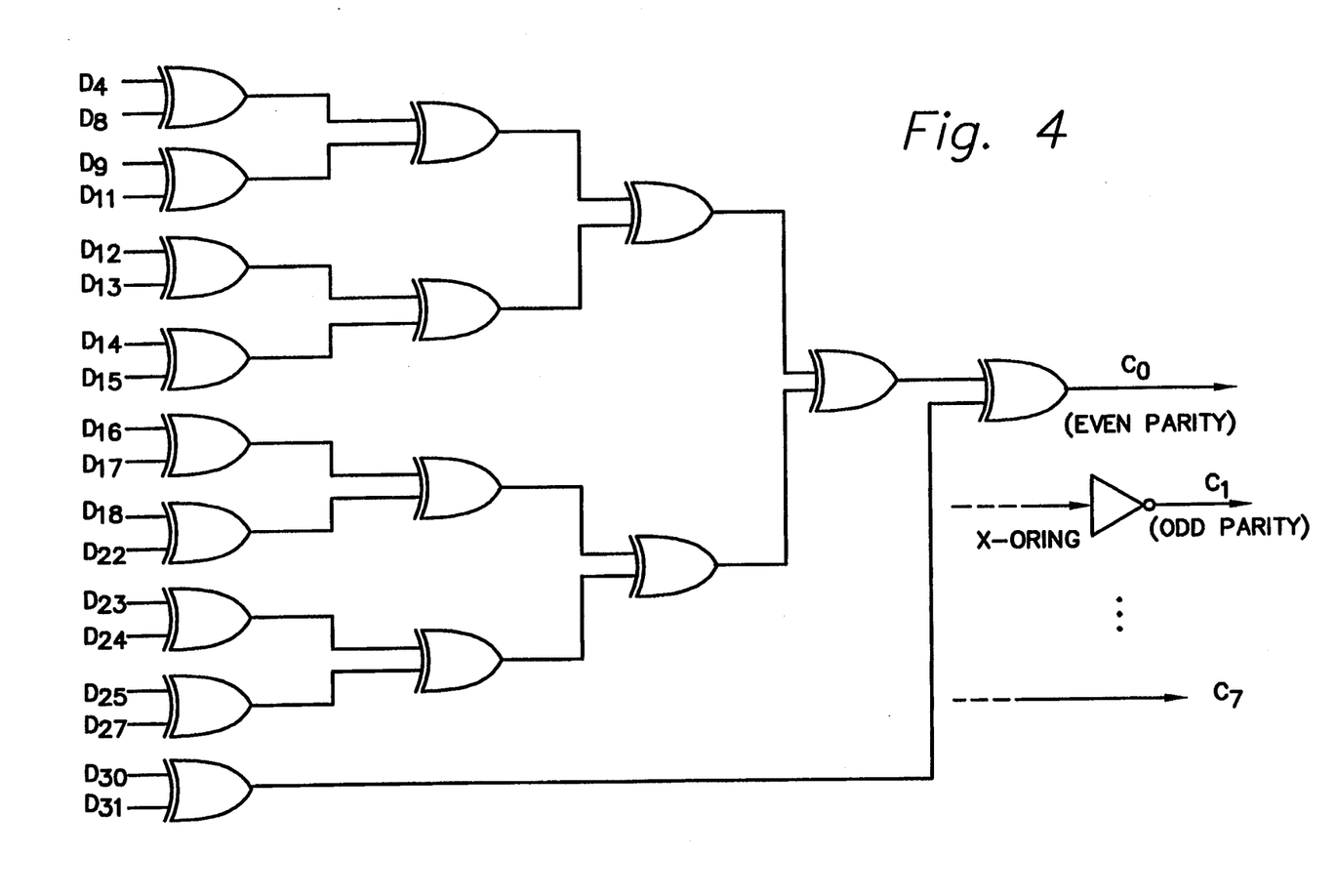
FIG. 4 shows the logic diagram of the matrix of FIG. 3.

The parity matrix (XOR matrix) 200, 201, of the preferred embodiment of the present invention is shown in FIGS. 3 and 4. FIG. 3 shows the matrix for generating the check bits $C_0$ through $C_7$. Where an "x" is included under participating data bit in the matrix, that data bit is included in the exclusive ORing process for generating the parity value i.e., the check bit. Conversely, where no "x" is indicated, the corresponding data bit is not included in generating the parity value of the check bit. Where even parity is included no inversion is performed. Where odd parity is indicated, such as for check bit $C_1$, the result of the X-ORing process is inverted as shown in FIG. 4. FIG. 4 shows a logic diagram of the XOR matrix 200, 201, of the preferred embodiment of the present invention, a cascaded arrangement of 2 input exclusive OR gates, the participating bits being inputted to the logic of the XOR matrix, as shown in FIG. 4. Referring to FIG. 3 and FIG. 4, data bits 4, 8, 9, 11, 12, 13, 14, 15, 16, 17, 18, 22, 23, 24, 25, 27, 30, and 31 are participating data bits for the generation of the first check bit $C_0$. Thus the inputs to the logic of the XOR matrix of FIG. 4 for generating the $C_0$ check bit include those participating data bits indicated above, and shown in the matrix of FIG. 3. It will be recognized by those skilled in the art that different combination and/or configurations of the participating data bits can be utilized and achieve the same result. In a similar fashion the exclusive ORing process for the generation of the other check bits is performed in accordance with the matrix of FIG. 3.

Figure 5:
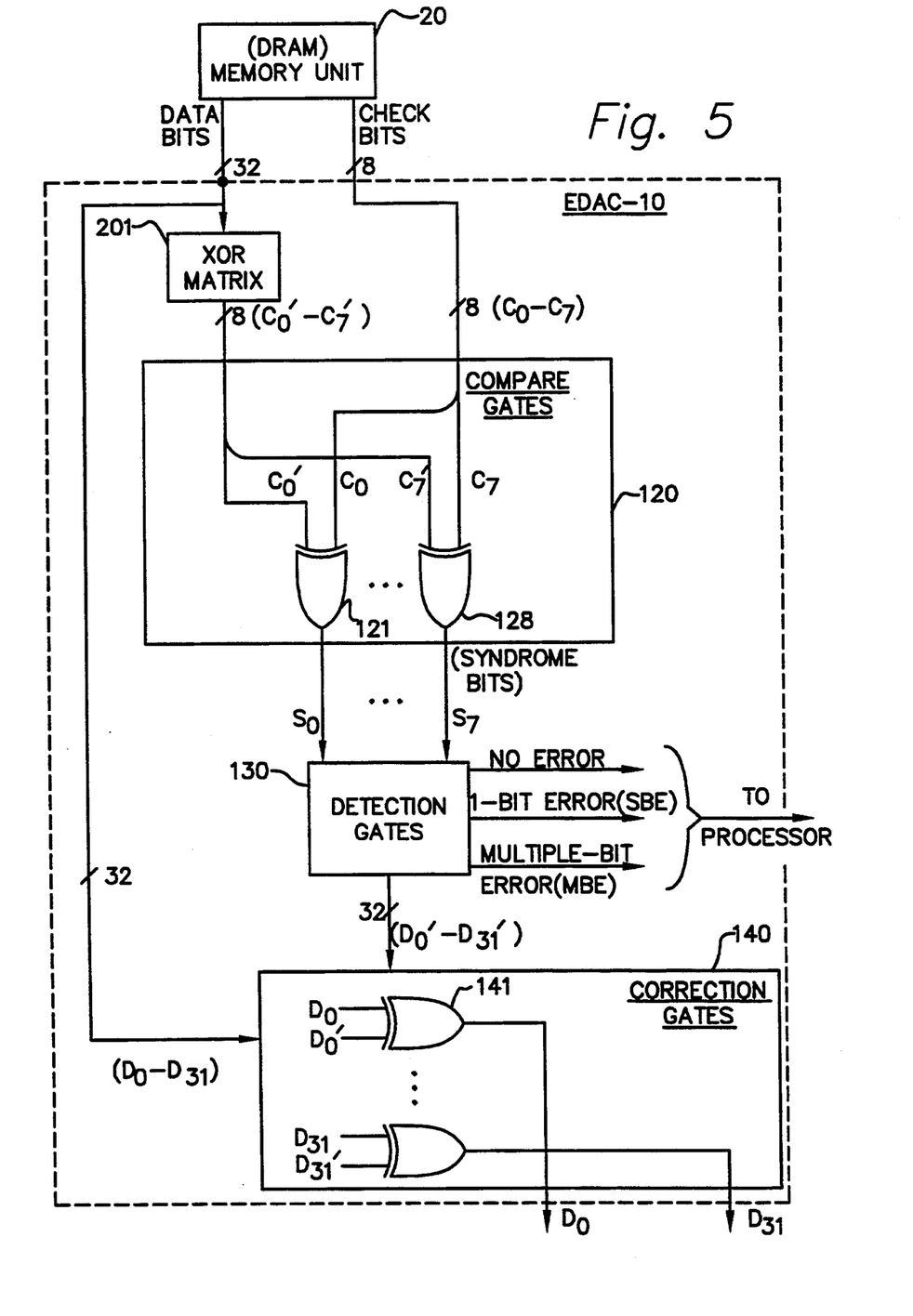
FIG. 5 shows a combination block/logic diagram of the EDAC apparatus of the preferred embodiment of the present invention.

Referring to FIG. 5, there is shown a combination block/logic diagram of EDAC apparatus 10 of the preferred embodiment of the present invention. The EDAC apparatus 10 includes an operative connection to the memory unit 20, the EDAC apparatus 10 is shown including only the XOR matrix 201 since the following discussion is concerned with checking of the data as a result of a read operation of the memory unit 20. When data is read from a specified location in the memory unit, the 32 data bits, $D_0$–$D_{31}$, are coupled to the XOR matrix 201 and check bits $C_0'$–$C_7'$ are generated as discussed above in conjunction with the discussion of the XOR matrix of FIGS. 3 and 4, the check bits $C_0'$–$C_7'$ being coupled to compare gates logic 120. The 8 check bits $C_0$–$C_7$, associated with the data stored and memory unit 20 are also coupled to the compare gates logic 120. Each corresponding check bit, $C_0$ and $C_0'$, $C_1$ and $C_1'$, ... are each exclusive ORed by XOR gates 121–128, the output of these gates being the syndrome bits $S_0$–$S_7$. Thus it can be seen that if the check bits as stored and the check bits as generated correspond, the syndrome bits are all a logic 0 value i.e., no error in the data bits exists.

The syndrome bits are decoded (mapped) to indicate conditions such as no error, multiple bit error, and single bit error. This mapping of the syndrome bits provides for detection (and subsequent correction) of single bit errors across the 32 bit word, detection of a 2 bit error across the 32 bit word including the check bits $C_0$–$C_7$, and detection of 1, 2, 3, and 4 bit errors of a single chip. The detection gates logic 130 also provides status signals which, in the preferred embodiment of present invention are coupled to the processor 30 as interrupt signals for handling of the processor 30. The detection gates logic 130 outputs 32 signals, $D_0'$ and $D_{31}'$ which are the results of decoding of the syndrome bits. These 32 signals indicate if a single bit error is present and specifically indicates which bit is in error. These signals, $D_0'$–$D_{31}'$ are coupled to correction gates logic 140. In addition the 32 data bits $D_0$–$D_{31}$ are also coupled to the correction gates logic 140. Corresponding data bits, i.e., $D_0$ and $D_0'$ are exclusive ORed by an exclusive OR gate 141, the output of the exclusive OR gate 141 being the data bit $D_0$ which is coupled to the processor 30 on the bus, shown in FIG. 2 as lines 107, 101. If no error exists on data bit $D_0$, the output of the detection gate for $D_0$ (the output signal being the $D_0'$ signal) is a logic 0. Thus, if $D_0$ is a logic 0, the output of the correction gates logic 140 remains a logic 0 and if, the data bit $D_0$ is a logic 1, the output remains as a logic 1. Conversely, if $D_0'$ is a logic 1, indicating an error with data bit $D_0$, and if the data bit $D_0$ is a logic 1, the output of exclusive OR gate 141 will be switched to a logic 0, thus correcting the bit detected as being in error. It will be recognized that various alternates can be utilized and the same result achieved. For example, the "NO ERROR" signal is implicit when no signal is present on the single bit error (SBE) line or multiple bit error (MBE) line. Therefore, as an alternate embodiment the no error line can be eliminated maintaining essentially the same function.

Figure 6:
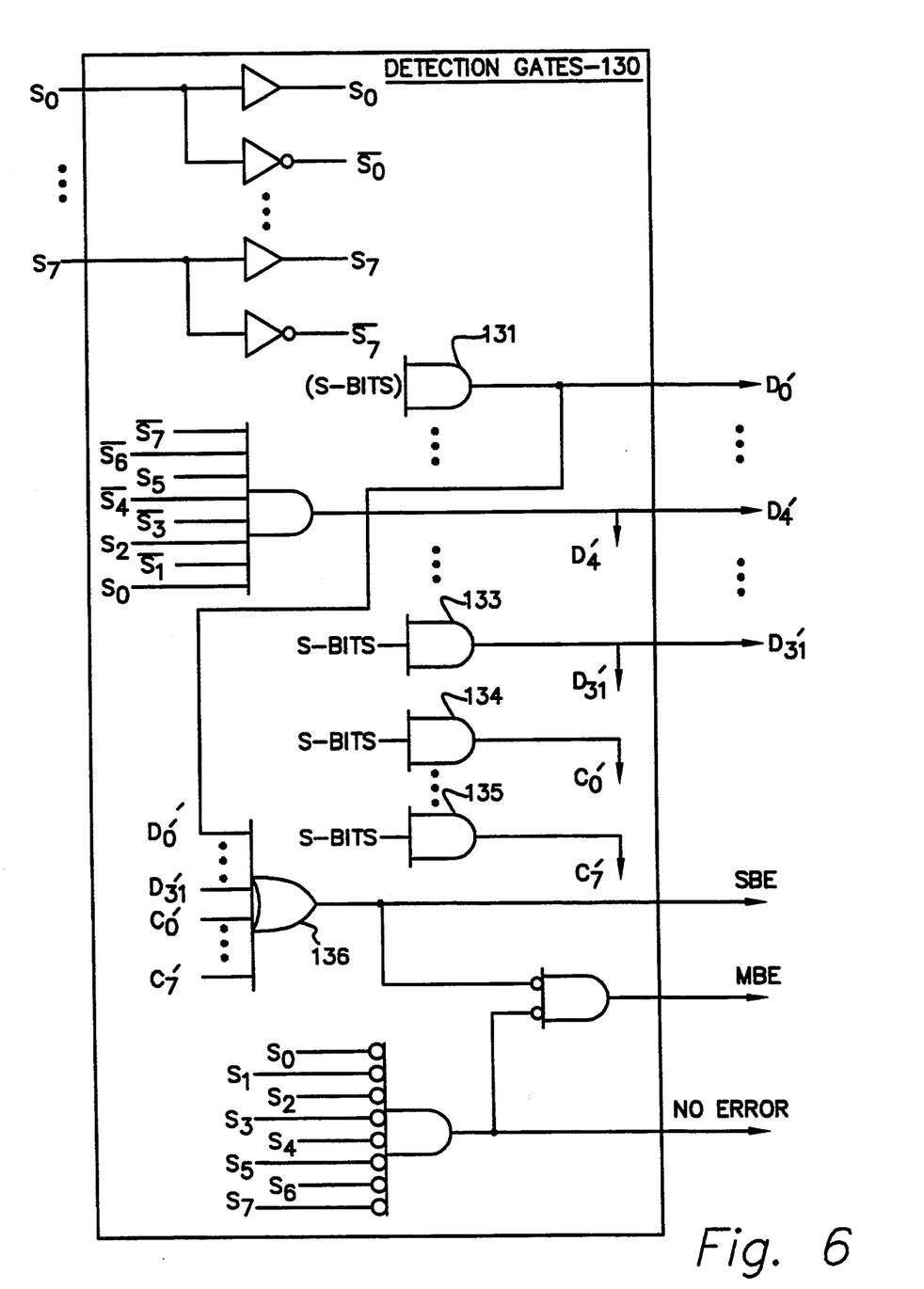
FIG. 6 shows a logic diagram of detection gate logic of the EDAD apparatus of the present invention.
Figure 7:
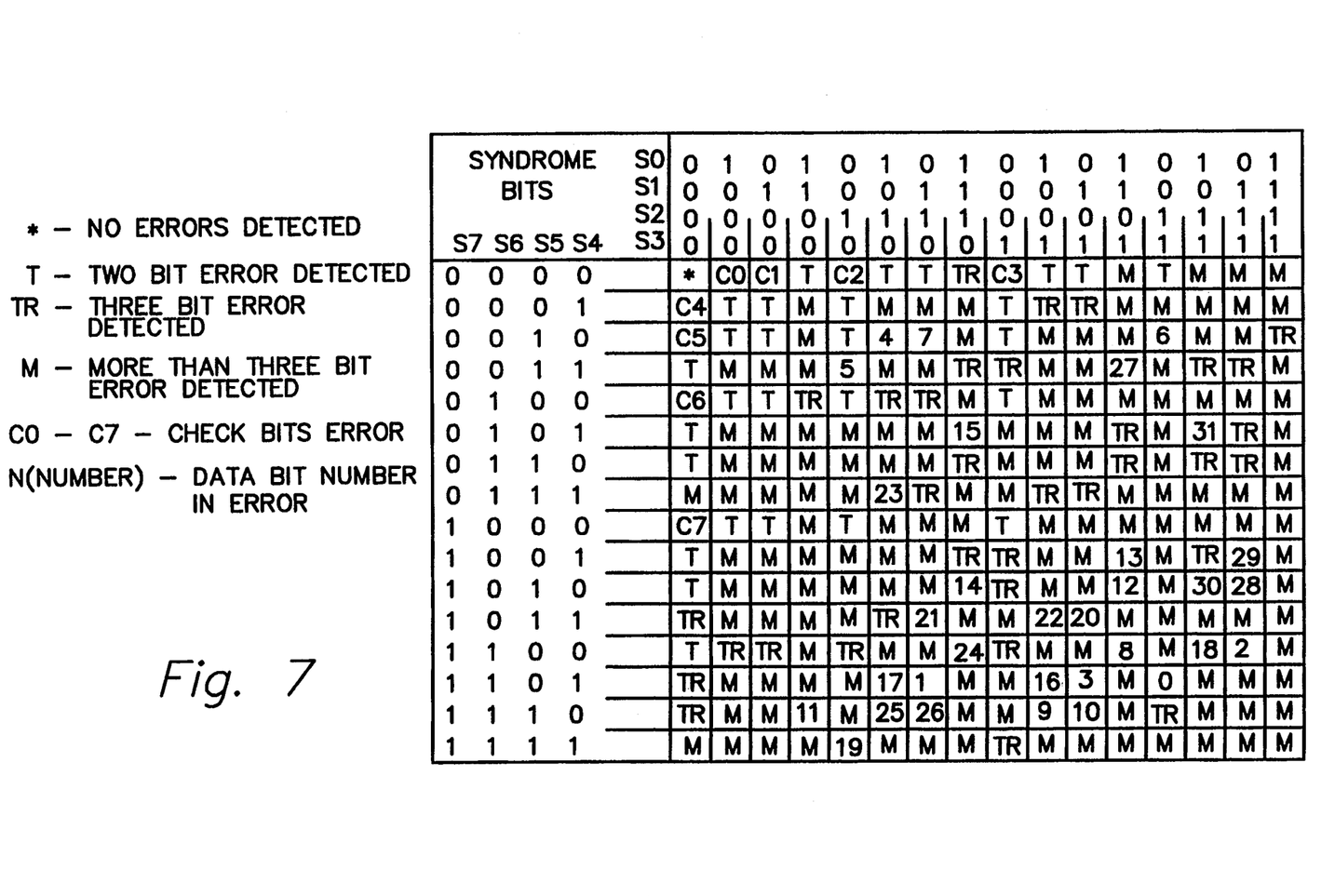
FIG. 7 shows the syndrome bit matrix (mapping) of the present invention for detecting a single and double bit error of a computer word, and for detecting all 2, 3, and 4 bit errors of the same memory device.

Referring to FIG. 6, there is shown a logic diagram of the detection gates logic 130. The syndrome bits $S_0$–$S_7$ are inputted and the inverted signals $\overline{S_0}$–$\overline{S_7}$ are generated. AND-gates 131–135 are utilized to generate the $D_0'$–$D_{31}'$ signals by a decode of the syndrome bit matrix of FIG. 7. Each of the 40 AND gates has 8 inputs (the inputs being a combination of $S_0$–$S_7$ and $\overline{S_0}$–$\overline{S_7}$) in accordance with the syndrome bit matrix. Thus in the syndrome bit matrix, if data bit 4 is in error, the syndrome bits are $S_0$, $\overline{S_1}$, $S_2$, $\overline{S_3}$, $\overline{S_4}$, $S_5$, $\overline{S_6}$, and $\overline{S_7}$, and the output of the AND gate 132 is a logic 1 if there is an error with the bit, i.e., bit 4. In a similar fashion all 32 data bits plus the 8 check bits are checked for an error, each having a unique combination of S bits as defined in the syndrome bit matrix. In addition the outputs of the AND gates are coupled to a multi input OR gate 136 for determining the status signal of a single bit error. The additional logic shows the generation of the other status signals outputted from the detection gates 130. The outputs $D_0'$–$D_{31}'$ are coupled to the correction gates logic 140 as discussed above.

The mapping of the syndrome bits matrix (shown in FIG. 7) and the check bit matrix (shown in FIG. 3), in conjunction with the associated hardware, yields the desired result of detecting and correcting a single bit error in a word of the 32 bit memory unit, detecting a double bit error of a 32 word of a 32 bit memory unit, and detecting a 2, 3, and 4 bit error within a chip of a memory unit, wherein the memory unit is comprised of BY-4 memory devices.

While there has been shown what is considered the preferred embodiment of the present invention, it will be manifest that many changes and modifications can be made therein without departing from the essential spirit and scope of the invention. It is intended, therefore, in the annexed claims, to cover all such changes and modifications which fall within the true scope of the invention.

We claim:

1. In a system including a processor and a memory unit, said memory unit storing information for subsequent user said memory unit being made up of a plurality of BY-4 memory devices thereby forming a plurality of computer words, each computer word having a predetermined number of bits, the computer word including a predetermined number of data bits and a predetermined number of check bits associated therewith, an error detection and correction(EDAC) apparatus interfacing with said memory unit for detecting and correcting a single bit error of the computer word, detecting a two bit error of the computer word, and detecting all two, three, and four bit errors of a single memory device, upon fetching said computer word from said memory unit, said EDAC apparatus comprising:

a) matrix logic means, operatively connected to said memory unit, for generating the predetermined number of check bits from preselected participating data bits of the data bits of the computer word being fetched;

b) compare gate means, operatively connected to said matrix logic means and to said memory unit to receive the predetermined number of check bits generated by said matrix logic means and the predetermined number of check bits stored in the memory unit associated with the computer word being fetched, respectively, for comparing corresponding check bits to generate corresponding syndrome bits therefrom;

c) detection logic means, operatively connected to said compare gate means to receive said syndrome bits, for decoding the syndrome bits in accordance with a predetermined matrix mapped to identify one and two bit errors of the computer word being fetched, to identify two, three, and four bit errors of the computer word when such errors are associated with the same BY-4 memory device, and to generate status signals associated with the decoding; and d) correction gate logic means, operatively connected to said detection logic means and to said memory unit, for correcting the data bit of the computer word identified as being in error, thereby outputting a corrected data portion of the fetched computer word, the identified data bit being corrected when such error is detected.

2. An EDAC apparatus according to claim 1, wherein said matrix logic means comprises:

n-plurality of exclusive OR gates, where n is equal to the number of check bits to be generated, each plurality of exclusive OR-gates being a cascade of two-input exclusive OR gates utilizing the preselected participating data bits of the data bits of the computer word, thereby resulting in n check bits having a predetermined parity of the preselected participating bits, the preselected participating data bits utilized with each plurality of exclusive OR gates in accordance with a predefined parity matrix.

3. An EDAC apparatus according to claim 2, wherein said detection logic means comprises:

m decode gates, where m equals the number of data bits, each decode gate having a predetermined number of input signals, the input signals being the syndrome bits, in accordance with the predetermined matrix, the predetermined matrix being mapped to indicate single gate errors, two bit errors for a computer word, and two, three, and four bit errors of a single memory device.

4. An EDAC apparatus according to claim 3, wherein said detection logic means further comprises:

a) an OR gate having m inputs, the output of each of the m decode gates being coupled to an input of the OR gate, thereby generating an output status signal indicating a single bit error;

b) first logic gate, having the combination of syndrome bits as inputs which decodes into a no-error condition, to generate the no-error status 32 signal; and c) second logic gate, coupled to the OR gate and to the first logic gate, for combining the no-error status signal and the signal bit error signal to generate a multi bit error status signal.

5. An EDAC apparatus according to claim 4 wherein said no-error status signal, said multi bit error status signals, and said signal bit error status signal are coupled to said processor as an interrupt signal.

6. An EDAC apparatus according to claim 1, wherein said detection logic means comprises:

m decode gates, where m equals the number of data bits, each decode gate having a predetermined number of input signals, the input signals .being the syndrome bits, in accordance with the predetermined matrix, the predetermined matrix being mapped to indicate single gate errors, two bit errors for a computer word, and two, three, and four bit errors of a single memory device.

7. An EDAC apparatus according to claim 6, wherein said detection logic means further comprises:

a) an OR gate having m inputs, the output of each of the m decode gates being coupled to an input of the OR gate, thereby generating an output status signal indicating a single bit error;

b) first logic gate, having the combination of syndrome bits as inputs which decodes into a no-error condition, to generate the no-error status 32 signal; and c) second logic gate, coupled to the OR gate and to the first logic gate, for combining the no-error status signal and the signal bit error signal to generate a multi bit error status signal.

8. An EDAC apparatus according to claim 7 wherein said no-error status signal, said multi bit error status signals, and said signal bit error status signal are coupled to said processor as an interrupt signal.

* * * * *